(12) United States Patent
Roy et al.

(10) Patent No.: US 12,744,532 B1
(45) Date of Patent: Sep. 22, 2026

(54) LOW CONTENTION HIGH REFERENCE OFFSET TOLERANT LEVEL SHIFTER

(71) Applicant: Synopsys, Inc., Sunnyvale, CA (US)

(72) Inventors: Abhishek Roy, West Bengal (IN); Divaker Sharma, Sambhal (IN); Kailash Kumar, Hazaribag (IN); Akhil Thotli, Andhra Pradesh (IN)

(73) Assignee: Synopsys, Inc., Sunnyvale, CA (US)

( * ) Notice: Subject to any disclaimer, the term of this patent is extended or adjusted under 35 U.S.C. 154(b) by 0 days.

(21) Appl. No.: 18/895,626

(22) Filed: Sep. 25, 2024

(51) Int. Cl.
*H03K 19/0185* (2006.01)
*H03K 3/356* (2006.01)

(52) U.S. Cl.
CPC ............... *H03K 19/018507* (2013.01); *H03K 3/356017* (2013.01)

(58) Field of Classification Search
CPC ....... H03K 19/018507; H03K 19/0185; H03K 19/018514; H03K 19/018521; H03K 19/018528; H03K 3/356; H03K 3/356017; H03K 3/356034; H03K 3/356104; H03K 3/356113; H03K 19/0175; H03K 19/017509
See application file for complete search history.

(56) References Cited

U.S. PATENT DOCUMENTS 11,916,549 B1 * 2/2024 Mathur ............ H03K 3/356182

* cited by examiner

*Primary Examiner* — Jung Kim
(74) *Attorney, Agent, or Firm* — Patterson + Sheridan, LLP

(57) ABSTRACT

A level shifter implemented with contention mitigation is disclosed. The level shifter generally includes: an input transistor pair; a first cascode transistor pair coupled in cascode with the input transistor pair, respectively; first cross-coupled transistors; a second cascode transistor pair coupled in cascode with the first cross-coupled transistors, respectively; a first level shifter transistor pair having gates coupled to drains of the second cascode transistors pair, respectively; and a first contention mitigation transistor pair coupled between a first reference voltage node and the first level shifter transistor pair, respectively.

13 Claims, 6 Drawing Sheets

LOW CONTENTION HIGH REFERENCE OFFSET TOLERANT LEVEL SHIFTER

TECHNICAL FIELD

The present disclosure generally relates to an electronic circuit, and more particularly, to circuitry for a level shifter with contention mitigation.

BACKGROUND

Level shifters are important components in electronic circuits that bridge the voltage gap between different circuit components. Analog and digital circuit components may interface with each other while operating at different voltage levels. Level shifters may be used to bridge this gap in voltage levels. To convert signals from one logic level or voltage level to another, a level shifter may be used which may also be referred to as a voltage level translator or logic-level shifter.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figure 1:
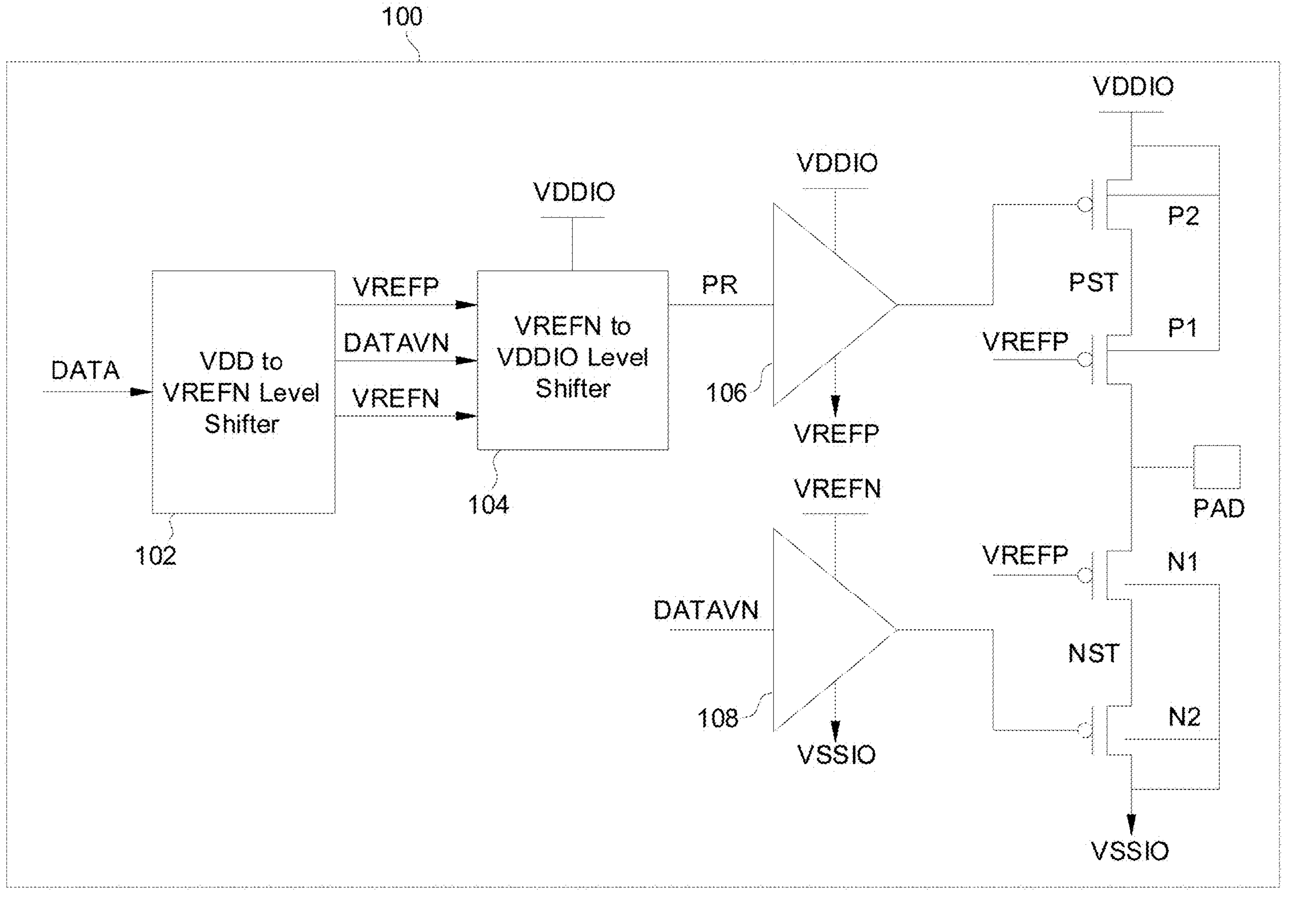
FIG. 1 illustrates level shifters for driving transistors of an input output (IO) device, in accordance with certain aspects of the present disclosure.

Conventional high voltage level shifters suffer from contention during a rising transition of the level shifter output, leading to degradation in output timing parameters, and in some cases, functional failure of input-output (IO) devices due to high offset on reference signals. Certain aspects of the present disclosure are directed towards a contention mitigation circuit for a level shifter. The contention mitigation circuit may remove the contention between transistors of the level shifter, as described in more detail herein. The contention mitigation circuit improves the output timing parameters of the level shifter, preventing functionality failure for IO devices even with high offsets between reference signals. The level shifter with contention mitigation described herein may be used across a wide range of applications of bus interfaces, including general purpose input/output (GPIO), inter-integrated circuit (I2C), improved inter-integrated circuit (I3C), secure digital input/output (SDIO), or serial peripheral interface (SPI).

Certain aspects of the present disclosure provide one or more advantages including, but not limited to, improved power, performance, and area (PPA). For example, certain aspects reduce the level shifter's dynamic power consumption and the static current leakage. By mitigating the contention between transistors of the level shifter, the output timing parameters (e.g., duty cycle and delay) of the level shifter may be improved. The level shifter may be able to support higher frequency operations with higher offsets of analog reference voltages provided to the level shifter, providing improved noise immunity. Certain aspects also allow for reduced area consumption. That is, an increased number of IO devices may be driven simultaneously using the same reference signal generator without the logic failure of the IO devices, allowing for chip area to be reduced.

High voltage supply (VDDIO) input/output (IO) devices may use analog reference voltages to overcome possible device stress issues. For example, the IO devices may use a reference voltage (e.g., referred to as VREFP) for driving p-type metal-oxide-semiconductor (PMOS) transistors and a reference voltage (e.g., referred to as VREFN) for driving n-type metal-oxide-semiconductor (NMOS) transistors. VREFN and VREFP may be generated via a reference signal generator. For high voltage tolerant IO devices, level shifting from a digital supply voltage to an interface supply voltage may involve a two-step process, including a first level shifter to shift from the digital supply to VREFN followed by a second level-shifter to shift from VREFN to VDDIO (e.g., interface supply voltage). Some VREFN to VDDIO level shifters may support a defined offset on VREFN and VREFP (e.g., 150 mV offset from the nominal voltage for VREFN and VREFP). At a frequency of 250 MHz, this offset may appear on both reference signals VREFN (e.g., resulting in VREFN minus 150 mV) and VREFP (e.g., resulting in VREFP plus 150 mV). As on example, for a 3.3V IO design (e.g., where VDDIO is equal to 3.3V) with a device stress limit of 1.8V (Vstress), two references may be used including VREFN which may be equal to Vstress (1.8V) and VREFP which may be equal to VDDIO minus Vstress or 1.5V.

FIG. 1 illustrates level shifters for driving NMOS and PMOS transistors of an IO device 100, in accordance with certain aspects of the present disclosure. A level shifter 102 may receive data (e.g., labeled "DATA") that may be in the VDDC (core supply) domain (e.g., 0.8V). The data may be level shifted from VDDC to VREFN, providing level shifted data (labeled "DATAVN"). DATAVN may be provided to a level shifter 104. The level shifter 104 may also receive VREFP, VREFN, and VDDIO. The level shifter 104 may level shift DATAVN from VREFN to VDDIO to generate a pre-driver signal (PR) that is provided as input to a PMOS gate driver 106. The PMOS driver may receive VDDIO as a supply voltage and VREFP as a reference potential. The driver 106 may drive a gate of a PMOS transistor P2, which may be coupled to a pad through a PMOS transistor P1. The gate of the PMOS transistor P1 may be driven via VREFP. DATAVN may be used to drive an NMOS driver 108. The NMOS gate driver 108 may receiver VREFN as a supply voltage and VSSIO (e.g., zero volts) as a reference potential. The NMOS driver 108 may drive a gate of an NMOS transistor N2 which may be coupled to the pad through an NMOS transistor N1. The gate of NMOS transistor N1 may be driven via VREFN, as shown. Certain aspects are directed towards a level shifter, such as the level shifter 104, implemented with a contention mitigation circuit. Transistors N1, N2, P1, P2 shown in FIG. 1 may be referred to as "IO device transistors."

Figure 2:
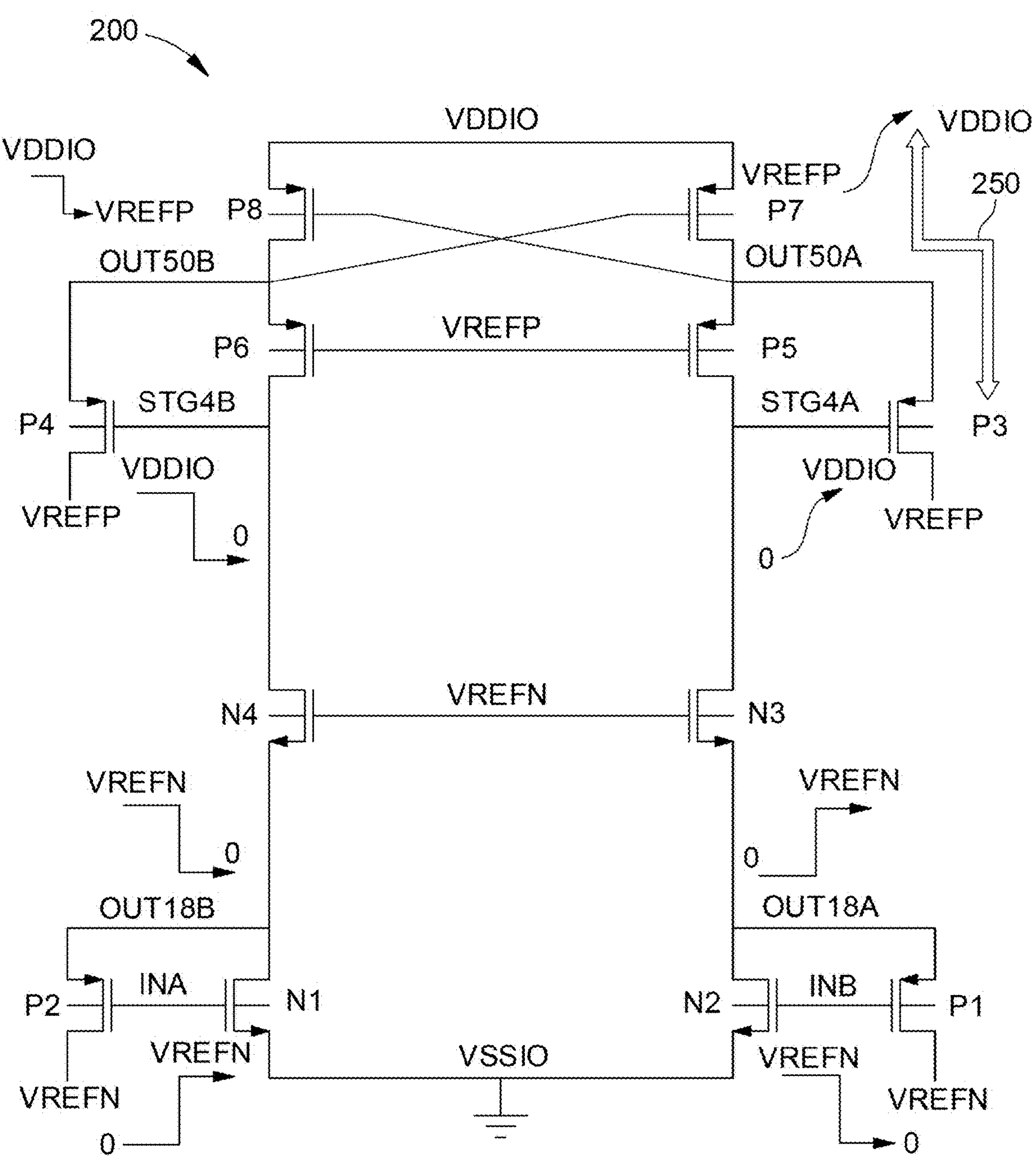
FIG. 2 illustrates an example level shifter.

FIG. 2 illustrates an example level shifter 200. The level shifter 200 includes inputs labeled "INA" and "INB." INA may be coupled to a gate of an input n-type metal-oxide-semiconductor (NMOS) transistor (N1) and INB may be coupled to a gate of an input NMOS transistor (N2), wherein sources of N1 and N2 are coupled to a reference potential node (VSSIO). The drains of N1 and N2 may be coupled to respective outputs labeled "OUT18B" and "OUT18A." As shown, a p-type metal-oxide-semiconductor (PMOS) transistor P1 may have a gate coupled to the gate of N1, a drain coupled to a VREFN node, and a source coupled to OUT18A. A PMOS transistor P2 may have a gate coupled to a gate of N2, a drain coupled to a VREFN node, and a source coupled to OUT18B. The sources of NMOS transistors N4, N3 may be coupled to OUT18B, OUT18A, respectively. Transistors P1, P2 may also be referred to herein as "a level shifter transistor pair." Transistors N3, N4 (also referred to herein as "cascode transistors") may be coupled in cascode with transistors N2, N3.

The gates of N3, N4 may be coupled to the VREFN node, as shown. The drains of N3, N4 may be coupled to nodes labeled "STG4A" and "STG4B." STG4A, STG4B may be coupled to drains of PMOS transistors P5, P6, where sources of P5, P6 are coupled to output nodes labeled "OUT50A" and "OUT50B," respectively. Transistors P5, P6 (also referred to herein as "cascode transistors") may be coupled in cascode with transistors P7, P8. OUT50A and OUT50B may be coupled to drains of cross-coupled PMOS transistors P7, P8, respectively, where sources of P7, P8 are coupled to a VDDIO node. For example, the gate of P7 may be coupled to a drain P8 and a gate of P8 may be coupled to a drain of P7. As shown, PMOS transistors P3, P4 may include gates coupled to STG4A, STG4B, respectively, drains coupled to the VREFP node, and sources coupled to OUT50A, OUT50B, respectively.

Initially, the input signal at INA may be at zero volts (e.g., logic low or VSSIO) and the complementary input INB may be at VREFN (e.g., logic high for the VREFN domain). Thus, P2 may be turned on, N1 may be turned off, P1 may be turned off, and N2 may be turned on such that OUT18B is at VREFN and OUT18A is at VSSIO (zero volts). STG4B may be at VDDIO and STG4A may be at zero volts. Thus, P4 may be turned off and P3 may be turned on, resulting in OUT50B being at VDDIO and OUT50A being at VREFP.

As shown, as the input signal at INA transitions from zero volts (e.g., logic low) to VREFN (e.g., logic high), the input signal at INB which is complementary to the input signal at INA transitions from VREFN to zero volts. Thus, P2 turns off, N1 turns on, N2 turns off, and P1 turns on, resulting in OUT18B transitioning to zero volts (VSSIO) and OUT18A transitioning to VREFN. N4 and N3 may be biased via VREFN. Thus, STG4B may transition from VDDIO to zero volts, turning on P4 resulting in OUT50B transitioning from VDDIO to VREFP. OUT50A should transition from VREFP to VDDIO. However, due to contention between P7 and P3, the transition of OUT50A may not occur as described in more detail herein.

The IO device may draw current from a reference signal generator while switching, leading to a drop (e.g., negative offset) in VREFN and rise (e.g., positive offset) in VREFP. These offset become more significant when multiple IO devices draw current simultaneously from a single reference signal generator. Moreover, supply and PAD parasitics (e.g., parasitic resistance, capacitance, and inductance) may introduce noise, resulting in more offset at VREFN and VREFP. The offsets of VREFN and VREFP may be more than the offset level supported by the level shifter, resulting in functional failure. For instance, as the input signal at INA rises from 0 volts to VREFN, a contention occurs at OUT50A between P7 and P3. With OUT50B transitioning from VDDIO to VREFP, P7 is turned on and tries to pull OUT50A to VDDIO. However, the gate voltage of P3 at STG4A may still be at zero volts, and thus, P3 is still on and resists OUT50A from transitioning to VDDIO. In other words, a contention occurs where P7 attempts to set OUT50A to VDDIO and P3 attempts to pull OUT50A down to VREFP.

Due to offset of VREFP as described, as VREFP rises, the source-to-gate voltage (VSG) of P3 increases (e.g., making the pull down strength of P3 greater) and VSG of P7 decreases (e.g., making the pull up strength of P7 weaker), making the contention more severe. Because of this contention at OUT50A, there is current flow 250 from VDDIO to VREFP through P7 and P3 which further reduces the strength of P7 and increases the strength of P3, making the contention worse and leading to OUT50A being nonresponsive. Similar contention occurs at OUT50B between P8 and P4 when complementary input signal at INB rises from 0 volts to VREFN. P7, P8, P3, and P4 may undergo higher hot carrier injection (HCl) degradation because of the current flow due to contention.

Figure 3:
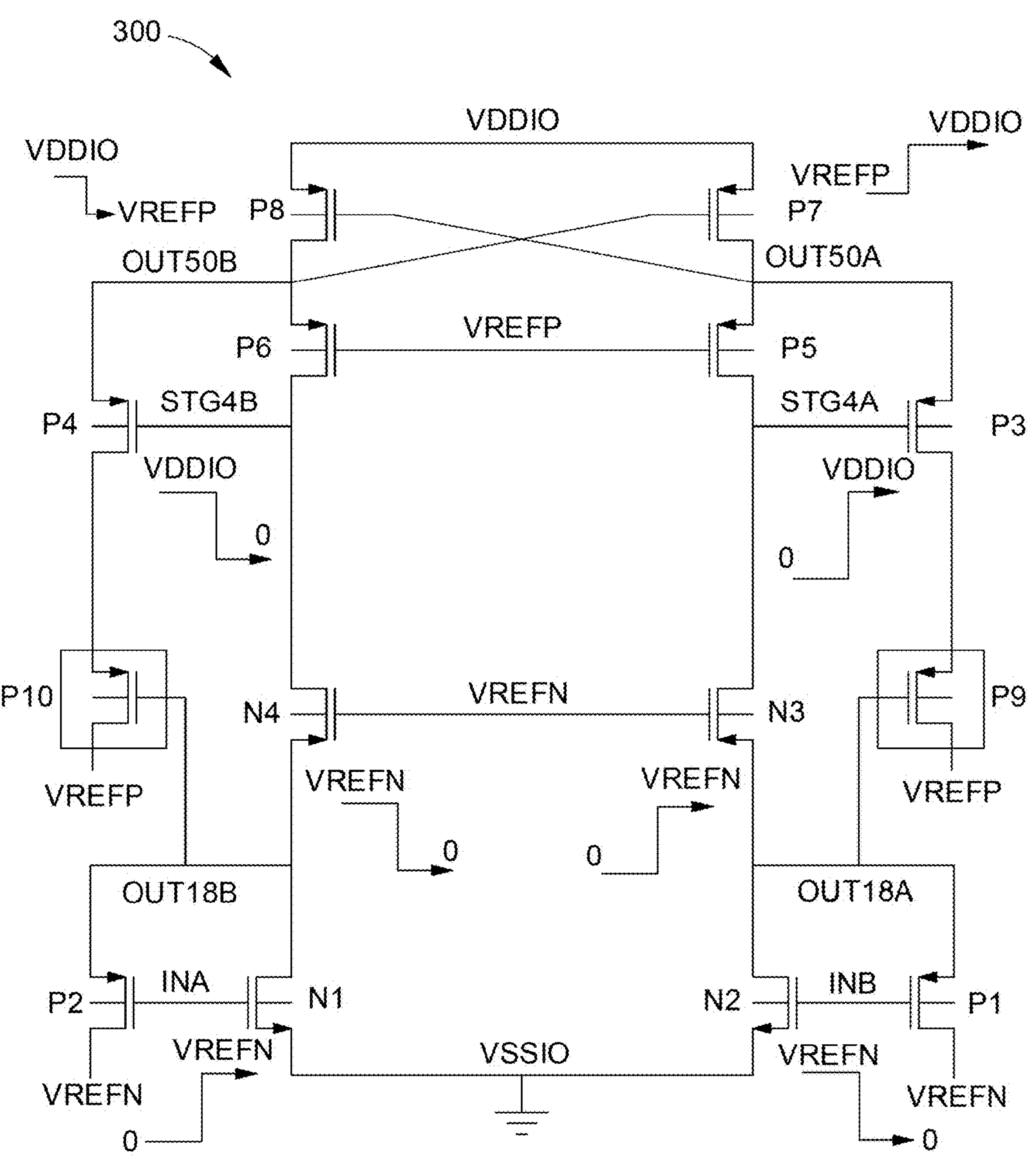
FIGS. 3 and 4 illustrate example level shifters implemented with a contention mitigation circuit, in accordance with certain aspects of the present disclosure.

FIG. 3 illustrates an example level shifter 300 implemented with a contention mitigation circuit, in accordance with certain aspects of the present disclosure. As shown, the level shifter 300 may include PMOS transistors P9, P10, where gates of P9, P10 are coupled to OUT18A, OUT18B, respectively. The drains of P9, P10 may be coupled to the VREFP node where sources of P9, P10 are coupled to drains of P3, P4, respectively. As the input signal at INA rises from 0 volts to VREFN, OUT18A also rises from 0 volts to VREFN which turns off P9, electrically decoupling the drain of P3 from the VREFP node and breaking the contention between P7 and P3 to allow OUT50A to rise to VDDIO through P7. Similarly, as the complementary input signal at INB rises from 0 volts to VREFN, OUT18B rises from 0 volts to VREFN which turns off P10 breaking the contention between P8 and P4, allowing OUT50B to rise to VDDIO through P8. Since contention between P7 and P3 and contention between P8 and P4 is removed, level shifter failure may be avoided and there may be no missing pulse at the IO pad. The architecture described herein may be extended to more than a twice VDD level shifter using VDD level tolerant devices, as described in more detail with respect to FIG. 4.

Figure 4:
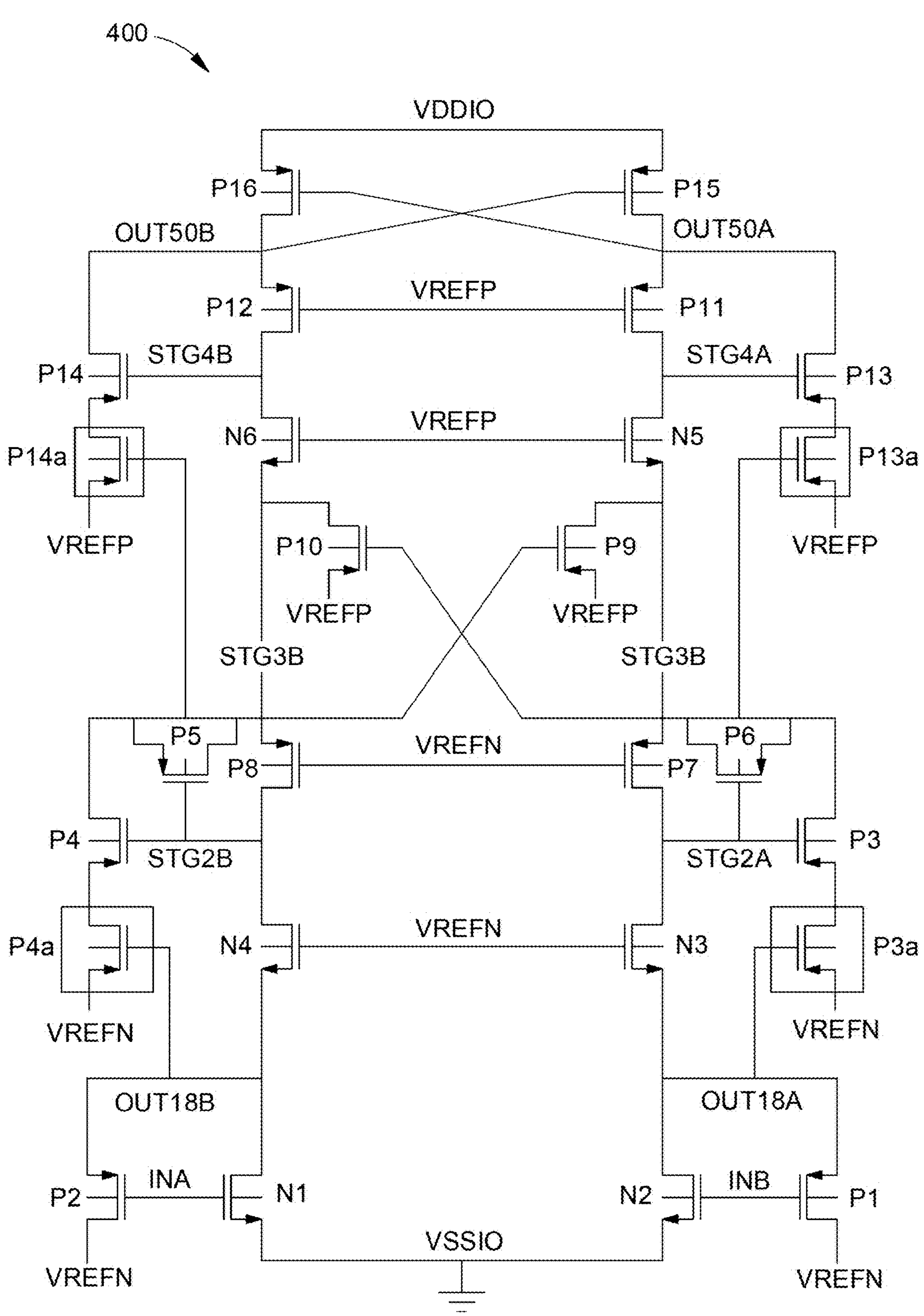

FIG. 4 illustrates an example level shifter 400 including a contention mitigation circuit, in accordance with certain aspects of the present disclosure. For example, VREFN may be 1.8 volts, VREFP may be 3.6 volts, and VDDIO may be 5 volts in this scenario. The level shifter 400 may include two effective level shifters. For example, N1, N2, N3, N4, P1, P2 of level shifter 400 may correspond to N1, N2, N3, N4, P1, P2 shown in level shifter 300. P7, P8, P9, P10 of level shifter 400 may correspond to P5, P6, P7, P8 shown in level shifter 300. The transistors N1, N2, N3, N4, P1, P2, P7, P8, P9, P10 of level shifter 400 form a first level shifter circuit used to generate a level shifted signal at nodes labeled "STG3A" and "STG3B" based on the input signals at INA, INB, where the level shifted signal transitions between VREFN and VREFP. In a similar manner as described with respect to FIG. 3, contention may exist between P4 and P10 and contention may exist between P3, and P9. PMOS transistor P4*a* (e.g., corresponding to P10 of level shifter 300) may be used to break the contention between P4 and P10 and PMOS transistor P3*a* (e.g., corresponding to P9 of level shifter 300) may be used to break the contention between P3 and P9.

A second level shifter circuit may be implemented to generate a level shifted signal at OUT50A, OUT50B that transitions between VREFP and VDDIO. For example, for the second effective level shifter, P15, P16 of level shifter 400 may correspond to P7, P8 of level shifter 300, P11, P12 of level shifter 400 may correspond to P5, P6 of level shifter 300, N5, N6 of level shifter 400 may correspond to N3, N4 of level shifter 300. P13 of level shifter 400 may correspond to P3 of level shifter 300 and P14 of level shifter 400 may correspond to P4 of level shifter 300. Similarly for the second level shifter circuit, contention may exist between P13 and P15 and contention may exist between P14 and P16. Thus, P13*a* may be used to break the contention between P13 and P15 and P14*a* may be used to break the contention between P14 and P16.

Figure 5:
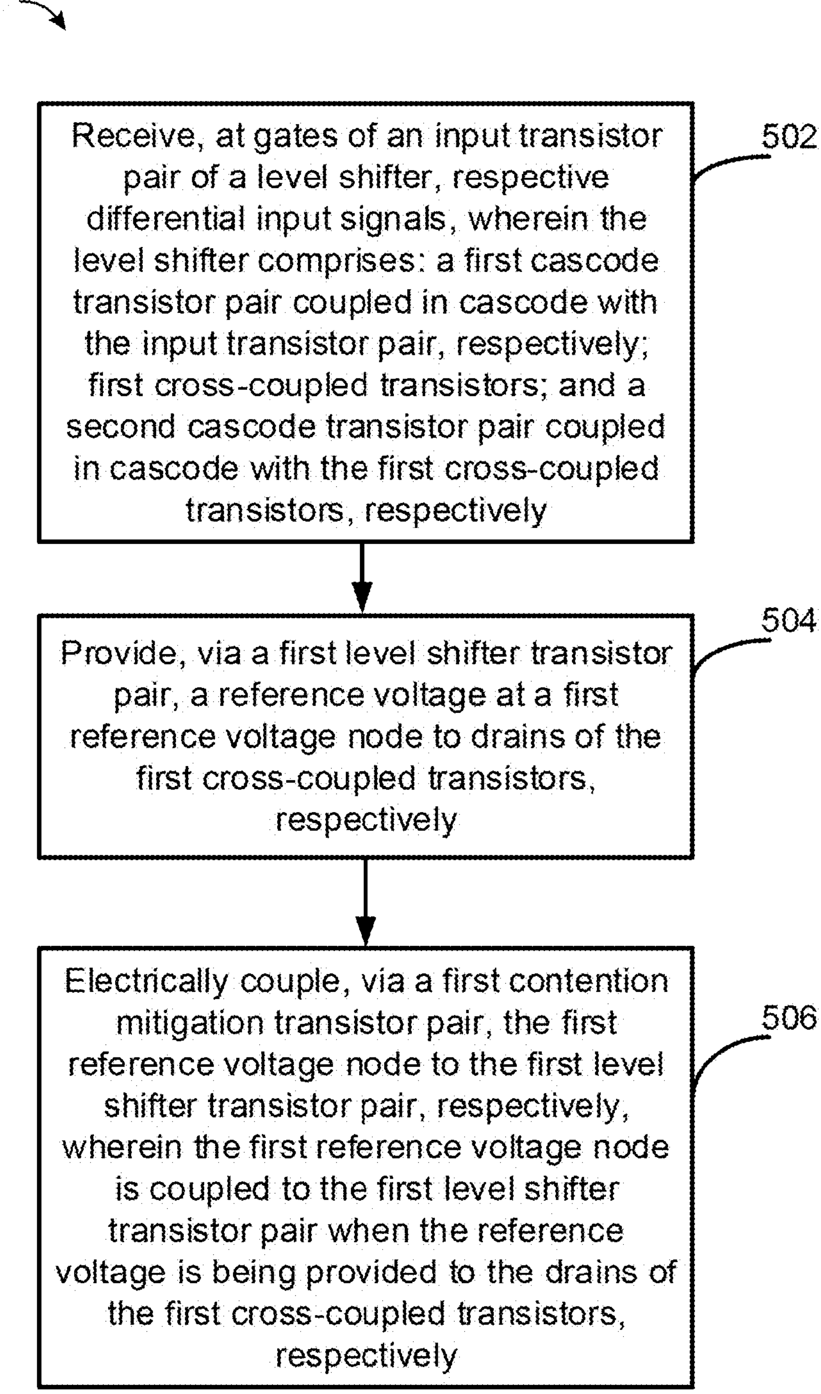
FIG. 5 is a flow diagram illustrating example operations for voltage level shifting, in accordance with certain aspects of the present disclosure.

FIG. 5 is a flow diagram illustrating example operations 500 for voltage level shifting, in accordance with certain aspects of the present disclosure. The operations 500 may be performed, for example, by a level shifter such as the level shifter 300 or level shifter 400.

At block 502, the level shifter may receive, at gates of an input transistor pair (e.g., N1 and N2 of FIG. 3 or FIG. 4) of the level shifter, respective input signals (e.g., at INA and INB). The level shifter may include: a first cascode transistor pair (e.g., N3 and N4) coupled in cascode with the input transistor pair, respectively; first cross-coupled transistors (e.g., P7 and P8 of FIG. 3 or P9 and P10 of FIG. 4); and a second cascode transistor pair (e.g., P5 and P6 of FIG. 3 or P7 and P8 of FIG. 4) coupled in cascode with the first cross-coupled transistors, respectively.

At block 504, the level shifter provides, via a first level shifter transistor pair (e.g., P3 and P4 of FIG. 3 or FIG. 4), a reference voltage (e.g., VREFP of FIG. 3 or VREFN of FIG. 4) at a first reference voltage node to drains of the first cross-coupled transistors, respectively. At block 506, the level shifter may electrically couple, via a first contention mitigation transistor pair (e.g., P9 of FIG. 3 of P3*a* of FIG. 4), the first reference voltage node to the first level shifter transistor pair, respectively. The first reference voltage node may be coupled to the first level shifter transistor pair when the reference voltage is being provided to the drains of the first cross-coupled transistors, respectively.

In some aspects, the first cross-coupled transistors may include a first transistor (e.g., P3 of FIG. 3 or FIG. 4) and a second transistor (e.g., P4 of FIG. 3 or FIG. 4). Sources of the first transistor and the second transistor may be coupled to a voltage rail (e.g., VDDIO of FIG. 3 or VREFP node of FIG. 4). A gate of the first transistor may be coupled to a drain of the second transistor and a gate of the second transistor is coupled to a drain of the first transistor. In some aspects, gates of the first contention mitigation transistor pair are coupled to drains of the input transistor pair, respectively. In some aspects, gates of a second level shifter transistor pair (e.g., P1 and P2 of FIG. 3 or FIG. 4) are coupled to gates of the input transistor pair, respectively, wherein the second level shifter transistor pair is coupled between a second reference voltage node and drains of the input transistor pair, respectively. In some aspects, gates of the first cascode transistor pair may be coupled to a second reference voltage node (e.g., VREFP of FIG. 3 or VREFN of FIG. 4). Gates of the second cascode transistor pair may be coupled to the first reference voltage node.

Certain aspects of the present disclosure are directed towards a level shifter. The level shifter generally includes: an input transistor pair; a first cascode transistor pair coupled in cascode with the input transistor pair, respectively; first cross-coupled transistors; a second cascode transistor pair coupled in cascode with the first cross-coupled transistors, respectively; a first level shifter transistor pair having gates coupled to drains of the second cascode transistors pair, respectively; and a first contention mitigation transistor pair coupled between a first reference voltage node and the first level shifter transistor pair, respectively.

In some aspects, the first cross-coupled transistors comprise: a first transistor; and a second transistor, wherein sources of the first transistor and the second transistor are coupled to a voltage rail, and wherein a gate of the first transistor is coupled to a drain of the second transistor and a gate of the second transistor is coupled to a drain of the first transistor.

In some aspects, gates of the first contention mitigation transistor pair are coupled to drains of the input transistor pair, respectively.

In some aspects, the level shifter further comprises a second level shifter transistor pair having gates coupled to gates of the input transistor pair, respectively, wherein the second level shifter transistor pair is coupled between a second reference voltage node and drains of the input transistor pair, respectively.

In some aspects, gates of the first cascode transistor pair are coupled to a second reference voltage node, and wherein gates of the second cascode transistor pair are coupled to the first reference voltage node.

In some aspects, the level shifter further comprises: second cross-coupled transistors; a third cascode transistor pair coupled in cascode with the second cross-coupled transistors, respectively; and a fourth transistor pair including drains coupled to drains of the third cascode transistor pair, respectively, and sources coupled to drains of the first cross-coupled transistors, respectively; a second level shifter transistor pair having gates coupled to drains of the third cascode transistors pair, respectively; and a second contention mitigation transistor pair coupled between a second reference voltage node and the second level shifter transistor pair, respectively.

In some aspects, the input transistor pair is configured to receive respective input signals at respective gates of the input transistor pair.

In some aspects, drains of the first cross-coupled transistors comprise respective outputs of the level shifter.

In some aspects, the first level shifter transistor pair is configured to provide a reference voltage at the first reference voltage node to drains of the first cross-coupled transistors, respectively; and the first contention mitigation transistor pair is configured to electrically couple the first reference voltage node to the first level shifter transistor pair, respectively, wherein the first reference voltage node is coupled to the first level shifter transistor pair when the reference voltage is being provided to the drains of the first cross-coupled transistors, respectively.

Some aspects are directed towards a method for voltage level shifting. The method generally includes: receiving, at gates of an input transistor pair of a level shifter, respective input signals, wherein the level shifter comprises: a first cascode transistor pair coupled in cascode with the input transistor pair, respectively; first cross-coupled transistors; and a second cascode transistor pair coupled in cascode with the first cross-coupled transistors, respectively; providing, via a first level shifter transistor pair, a reference voltage at a first reference voltage node to drains of the first cross-coupled transistors, respectively; and electrically coupling, via a first contention mitigation transistor pair, the first reference voltage node to the first level shifter transistor pair, respectively, wherein the first reference voltage node is coupled to the first level shifter transistor pair when the reference voltage is being provided to the drains of the first cross-coupled transistors, respectively.

In some aspects, the first cross-coupled transistors comprise: a first transistor; and a second transistor, wherein sources of the first transistor and the second transistor are coupled to a voltage rail, and wherein a gate of the first transistor is coupled to a drain of the second transistor and a gate of the second transistor is coupled to a drain of the first transistor.

In some aspects, gates of the first contention mitigation transistor pair are coupled to drains of the input transistor pair, respectively.

In some aspects, gates of a second level shifter transistor pair are coupled to gates of the input transistor pair, respectively, wherein the second level shifter transistor pair is coupled between a second reference voltage node and drains of the input transistor pair, respectively.

In some aspects, gates of the first cascode transistor pair are coupled to a second reference voltage node, and wherein gates of the second cascode transistor pair are coupled to the first reference voltage node.

Some aspects are directed towards an input output (IO) device. The IO device generally includes: an IO device transistor; a gate driver having an output coupled to a gate of the IO device transistor; a level shifter having an output coupled to an input of the gate driver, the level shifter comprising: an input transistor pair; a first cascode transistor pair coupled in cascode with the input transistor pair, respectively; first cross-coupled transistors, wherein a drain of one of the first cross-coupled transistor comprises the output of the level shifter; a second cascode transistor pair coupled in cascode with the first cross-coupled transistors, respectively; a first level shifter transistor pair having gates coupled to drains of the second cascode transistors pair, respectively; and a first contention mitigation transistor pair coupled between a first reference voltage node and the first level shifter transistor pair, respectively.

In some aspects, the first cross-coupled transistors comprise: a first transistor; and a second transistor, wherein sources of the first transistor and the second transistor are coupled to a voltage rail, and wherein a gate of the first transistor is coupled to a drain of the second transistor and a gate of the second transistor is coupled to a drain of the first transistor.

In some aspects, gates of the first contention mitigation transistor pair are coupled to drains of the input transistor pair, respectively.

In some aspects, the IO device further comprises a second level shifter transistor pair having gates coupled to gates of the input transistor pair, respectively, wherein the second level shifter transistor pair is coupled between a second reference voltage node and drains of the input transistor pair, respectively.

In some aspects, gates of the first cascode transistor pair are coupled to a second reference voltage node, and wherein gates of the second cascode transistor pair are coupled to the first reference voltage node.

In some aspects, the IO device further comprises: second cross-coupled transistors; a third cascode transistor pair coupled in cascode with the second cross-coupled transistors, respectively; a fourth transistor pair including drains coupled to drains of the third cascode transistor pair, respectively, and sources coupled to drains of the first cross-coupled transistors, respectively; a second level shifter transistor pair having gates coupled to drains of the third cascode transistors pair, respectively; and a second contention mitigation transistor pair coupled between a second reference voltage node and the second level shifter transistor pair, respectively.

Figure 6:
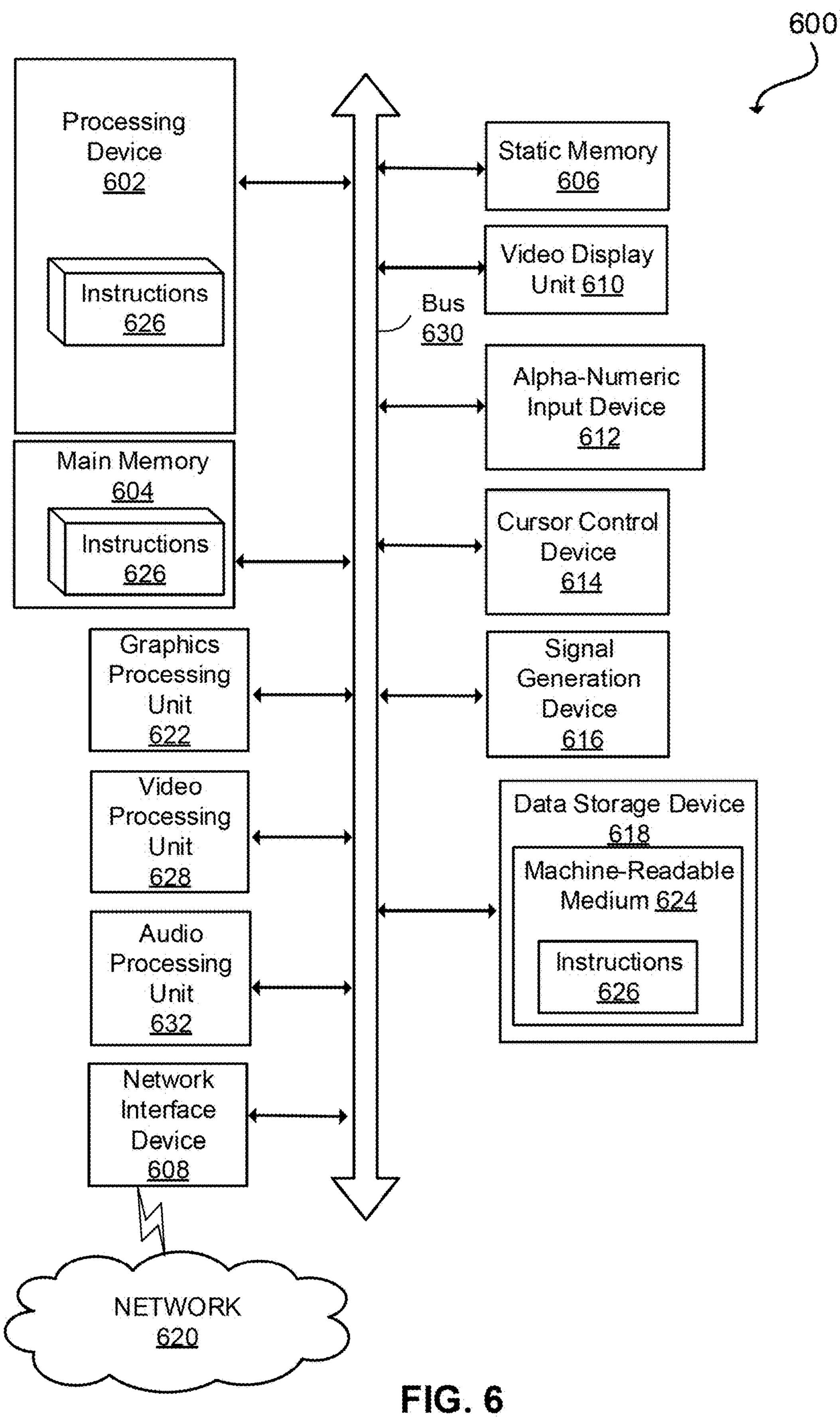
FIG. 6 illustrates an example machine of a computer system within which a set of instructions, for causing the machine to perform any one or more of the methodologies discussed herein, may be executed.

FIG. 6 illustrates an example machine of a computer system 600 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM), a static memory 606 (e.g., flash memory, static random access memory (SRAM), etc.), and a data storage device 618, which communicate with each other via a bus 630.

Processing device 602 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 may also be one or more special-purpose processing devices such as an application specific integrated circuit (ASIC), a field programmable gate array (FPGA), a digital signal processor (DSP), network processor, or the like. The processing device 602 may be configured to execute instructions 626 for performing the operations and steps described herein.

The computer system 600 may further include a network interface device 608 to communicate over the network 620. The computer system 600 also may include a video display unit 610 (e.g., a liquid crystal display (LCD) or a cathode ray tube (CRT)), an alphanumeric input device 612 (e.g., a keyboard), a cursor control device 614 (e.g., a mouse), a graphics processing unit 622, a signal generation device 616 (e.g., a speaker), graphics processing unit 622, video processing unit 628, and audio processing unit 632.

The data storage device 618 may include a machine-readable storage medium 624 (also known as a non-transitory computer-readable medium) on which is stored one or more sets of instructions 626 or software embodying any one or more of the methodologies or functions described herein. The instructions 626 may also reside, completely or at least partially, within the main memory 604 and/or within the processing device 602 during execution thereof by the computer system 600, the main memory 604 and the processing device 602 also constituting machine-readable storage media.

In some implementations, the instructions 626 include instructions to implement functionality corresponding to the present disclosure. While the machine-readable storage medium 624 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 602 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A level shifter, comprising:
- an input transistor pair;
- a first cascode transistor pair coupled in cascode with the input transistor pair, respectively;
- first cross-coupled transistors;
- a second cascode transistor pair coupled in cascode with the first cross-coupled transistors, respectively;
- a first level shifter transistor pair having gates coupled to drains of the second cascode transistors pair, respectively; and
- a first contention mitigation transistor pair coupled between a first reference voltage node and the first level shifter transistor pair, respectively, wherein gates of the first contention mitigation transistor pair are coupled to drains of the input transistor pair, respectively.

2. The level shifter of claim 1, wherein the first cross-coupled transistors comprise:
- a first transistor; and
- a second transistor, wherein sources of the first transistor and the second transistor are coupled to a voltage rail, and wherein a gate of the first transistor is coupled to a drain of the second transistor and a gate of the second transistor is coupled to a drain of the first transistor.

3. The level shifter of claim 1, further comprising a second level shifter transistor pair having gates coupled to gates of the input transistor pair, respectively, wherein the second level shifter transistor pair is coupled between a second reference voltage node and the drains of the input transistor pair, respectively.

4. The level shifter of claim 1, wherein gates of the first cascode transistor pair are coupled to a second reference voltage node, and wherein gates of the second cascode transistor pair are coupled to the first reference voltage node.

5. The level shifter of claim 1, further comprising:
- second cross-coupled transistors;
- a third cascode transistor pair coupled in cascode with the second cross-coupled transistors, respectively; and
- a fourth transistor pair including drains coupled to drains of the third cascode transistor pair, respectively, and sources coupled to drains of the first cross-coupled transistors, respectively;

a second level shifter transistor pair having gates coupled to drains of the third cascode transistors pair, respectively; and a second contention mitigation transistor pair coupled between a second reference voltage node and the second level shifter transistor pair, respectively.

6. The level shifter of claim 1, wherein the input transistor pair is configured to receive respective input signals at respective gates of the input transistor pair.

7. The level shifter of claim 1, wherein drains of the first cross-coupled transistors comprise respective outputs of the level shifter.

8. The level shifter of claim 1, wherein:

the first level shifter transistor pair is configured to provide a reference voltage at the first reference voltage node to drains of the first cross-coupled transistors, respectively; and the first contention mitigation transistor pair is configured to electrically couple the first reference voltage node to the first level shifter transistor pair, respectively, wherein the first reference voltage node is coupled to the first level shifter transistor pair when the reference voltage is being provided to the drains of the first cross-coupled transistors, respectively.

9. An input output (IO) device, comprising:

an IO device transistor;

a gate driver having an output coupled to a gate of the IO device transistor;

a level shifter having an output coupled to an input of the gate driver, the level shifter comprising:

an input transistor pair;

a first cascode transistor pair coupled in cascode with the input transistor pair, respectively;

first cross-coupled transistors, wherein a drain of one of the first cross-coupled transistor comprises the output of the level shifter;

a second cascode transistor pair coupled in cascode with the first cross-coupled transistors, respectively;

a first level shifter transistor pair having gates coupled to drains of the second cascode transistors pair, respectively; and a first contention mitigation transistor pair coupled between a first reference voltage node and the first level shifter transistor pair, respectively, wherein gates of the first contention mitigation transistor pair are coupled to drains of the input transistor pair, respectively.

10. The IO device of claim 9, wherein the first cross-coupled transistors comprise:

a first transistor; and a second transistor, wherein sources of the first transistor and the second transistor are coupled to a voltage rail, and wherein a gate of the first transistor is coupled to a drain of the second transistor and a gate of the second transistor is coupled to a drain of the first transistor.

11. The IO device of claim 9, further comprising a second level shifter transistor pair having gates coupled to gates of the input transistor pair, respectively, wherein the second level shifter transistor pair is coupled between a second reference voltage node and the drains of the input transistor pair, respectively.

12. The IO device of claim 9, wherein gates of the first cascode transistor pair are coupled to a second reference voltage node, and wherein gates of the second cascode transistor pair are coupled to the first reference voltage node.

13. The IO device of claim 9, further comprising:

second cross-coupled transistors;

a third cascode transistor pair coupled in cascode with the second cross-coupled transistors, respectively;

a fourth transistor pair including drains coupled to drains of the third cascode transistor pair, respectively, and sources coupled to drains of the first cross-coupled transistors, respectively;

a second level shifter transistor pair having gates coupled to drains of the third cascode transistors pair, respectively; and a second contention mitigation transistor pair coupled between a second reference voltage node and the second level shifter transistor pair, respectively.

* * * * *